United States Patent
Bongiovi

(10) Patent No.: US 7,519,189 B2
(45) Date of Patent: Apr. 14, 2009

(54) PROCESSING OF AN AUDIO SIGNAL FOR PRESENTATION IN A HIGH NOISE ENVIRONMENT

(75) Inventor: Anthony Bongiovi, 649 Whitmore Dr., Port St. Lucie, FL (US) 34984

(73) Assignee: Anthony Bongiovi, Port St. Lucie, FL (US)

( * ) Notice: Subject to any disclaimer, the term of this patent is extended or adjusted under 35 U.S.C. 154(b) by 1 day.

(21) Appl. No.: 11/764,446

(22) Filed: Jun. 18, 2007

(65) Prior Publication Data

US 2008/0112576 A1 May 15, 2008

Related U.S. Application Data

(63) Continuation of application No. 10/914,234, filed on Aug. 10, 2004, now Pat. No. 7,254,243.

(51) Int. Cl.
*H03G 7/00* (2006.01)

(52) U.S. Cl. .................. 381/106; 381/103; 381/98; 381/107

(58) Field of Classification Search ......... 381/102–108, 381/98, 57; 333/14; 455/72
See application file for complete search history.

(56) References Cited

U.S. PATENT DOCUMENTS

| | | | |
|---|---|---|---|
| 4,162,462 A * | 7/1979 | Endoh et al. ............ | 333/14 |
| 4,353,035 A | 10/1982 | Schroeder | |
| 4,363,007 A | 12/1982 | Haramoto et al. | |
| 4,538,297 A | 8/1985 | Waller | |
| 4,584,700 A | 4/1986 | Scholz | |
| 4,677,645 A | 6/1987 | Kaniwa et al. | |
| 4,704,726 A | 11/1987 | Gibson | |
| 4,739,514 A | 4/1988 | Short et al. | |
| 4,815,142 A | 3/1989 | Imreh | |
| 5,133,015 A | 7/1992 | Scholz | |
| 5,361,381 A | 11/1994 | Short | |
| 5,617,480 A | 4/1997 | Ballard et al. | |
| 5,872,852 A * | 2/1999 | Dougherty ............ | 381/57 |
| 6,078,670 A * | 6/2000 | Beyer ................ | 381/57 |
| 7,006,653 B2 | 2/2006 | Guenther | |
| 7,254,243 B2 * | 8/2007 | Bongiovi ............ | 381/106 |
| 7,274,795 B2 * | 9/2007 | Bongiovi ............ | 381/106 |

OTHER PUBLICATIONS

"NovaSound International Inc", http://www.novasoundint.com/new_page_1.htm, 2004.

* cited by examiner

*Primary Examiner*—Vivian Chin
*Assistant Examiner*—Jason R Kurr
(74) *Attorney, Agent, or Firm*—Sheppard, Mullin, Richter & Hampton LLP

(57) ABSTRACT

In accordance with the invention, audio signals are specially processed for sound presentation in a high noise environment. The electrical signal representative of the sound is first subjected to equalization to preferentially reduce the magnitude of bass signals while increasing the magnitude of treble signals. The equalized signal is then compressed, and the compressed signal is subjected to "mirror image" equalization which increases the magnitude of bass signals while reducing the magnitude of treble signals. The resulting signal fed to the speakers provides a sound presentation of compressed volume range and a bass-rich sound spectrum. It is particularly useful for providing quality sound presentation in a high noise environment.

8 Claims, 7 Drawing Sheets

PROCESSING OF AN AUDIO SIGNAL FOR PRESENTATION IN A HIGH NOISE ENVIRONMENT

CROSS REFERENCE TO RELATED APPLICATIONS

The present application is a continuation of, and claims priority under 35 U.S.C. § 120 to, U.S. patent application Ser. No. 10/914,234 filed Aug. 10, 2004, now U.S. Pat. No. 7,254,243, which is expressly incorporated fully herein.

FIELD OF THE INVENTION

This invention relates to apparatus for processing an audio signal and, in particular, to apparatus which is particularly useful for presenting enhanced quality sound in a high noise environment.

BACKGROUND OF THE INVENTION

The presentation of quality sound production in moving automobiles, boats and aircraft is particularly challenging due to the high noise content of the environment in which the sound is presented. The bass response in such a system is generally inadequate. The bass response can be increased ("boosted") with an equalizer, but this muffles the treble, resulting in a muffled quality audio.

In addition to muffling treble, a bass boost undesirably increases the dynamic range of the sound presentation. In a noisy environment, there is a relatively small range between the volume floor set by the noise (typically 80 dB in moving vehicles) and the volume ceiling set by the physiology of the ear. In a noisy environment, increases in the dynamic range of a sound presentation are aesthetically undesirable because they approach the volume at which sound becomes unpleasant or even painful (typically around 110 dB). Accordingly, there is a need for a new approach for processing audio signals for presentation in a high noise environment.

SUMMARY OF THE INVENTION

In accordance with the invention, audio signals are specially processed for sound presentation in a high noise environment. The electrical signal representative of the sound is first subjected to equalization to preferentially reduce the magnitude of bass signals while increasing the magnitude of treble signals. The equalized signal is then compressed, and the compressed signal is subjected to "mirror image" equalization which increases the magnitude of bass signals while reducing the magnitude of treble signals. The resulting signal fed to the speakers provides a sound presentation of compressed volume range and a bass-rich sound spectrum. It is particularly useful for providing quality sound presentation in a high noise environment.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

DETAILED DESCRIPTION

Figure 1A:
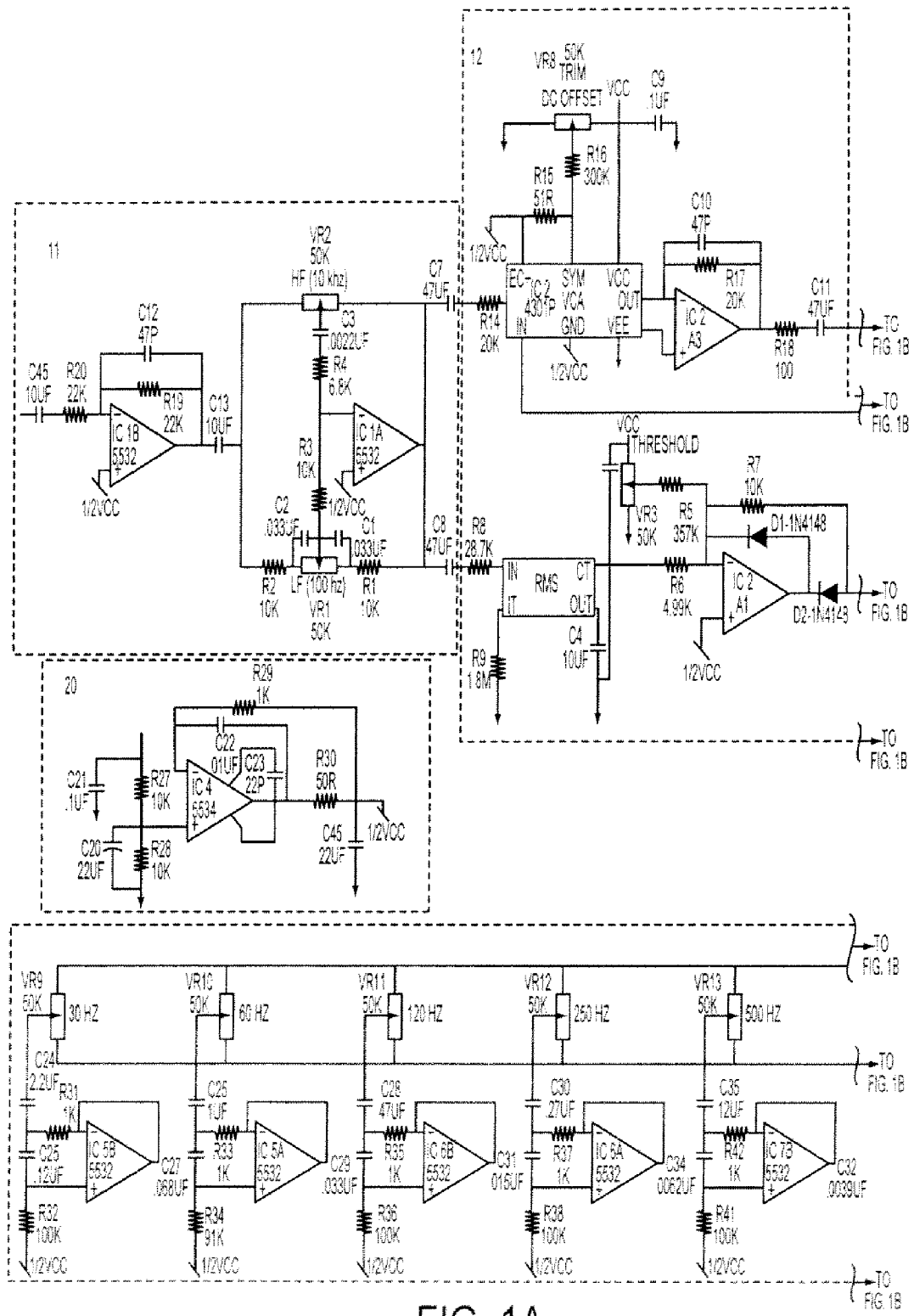
FIGS. 1A-1B is a schematic view of an audio system for presenting sound in a high noise environment.
Figure 1B:
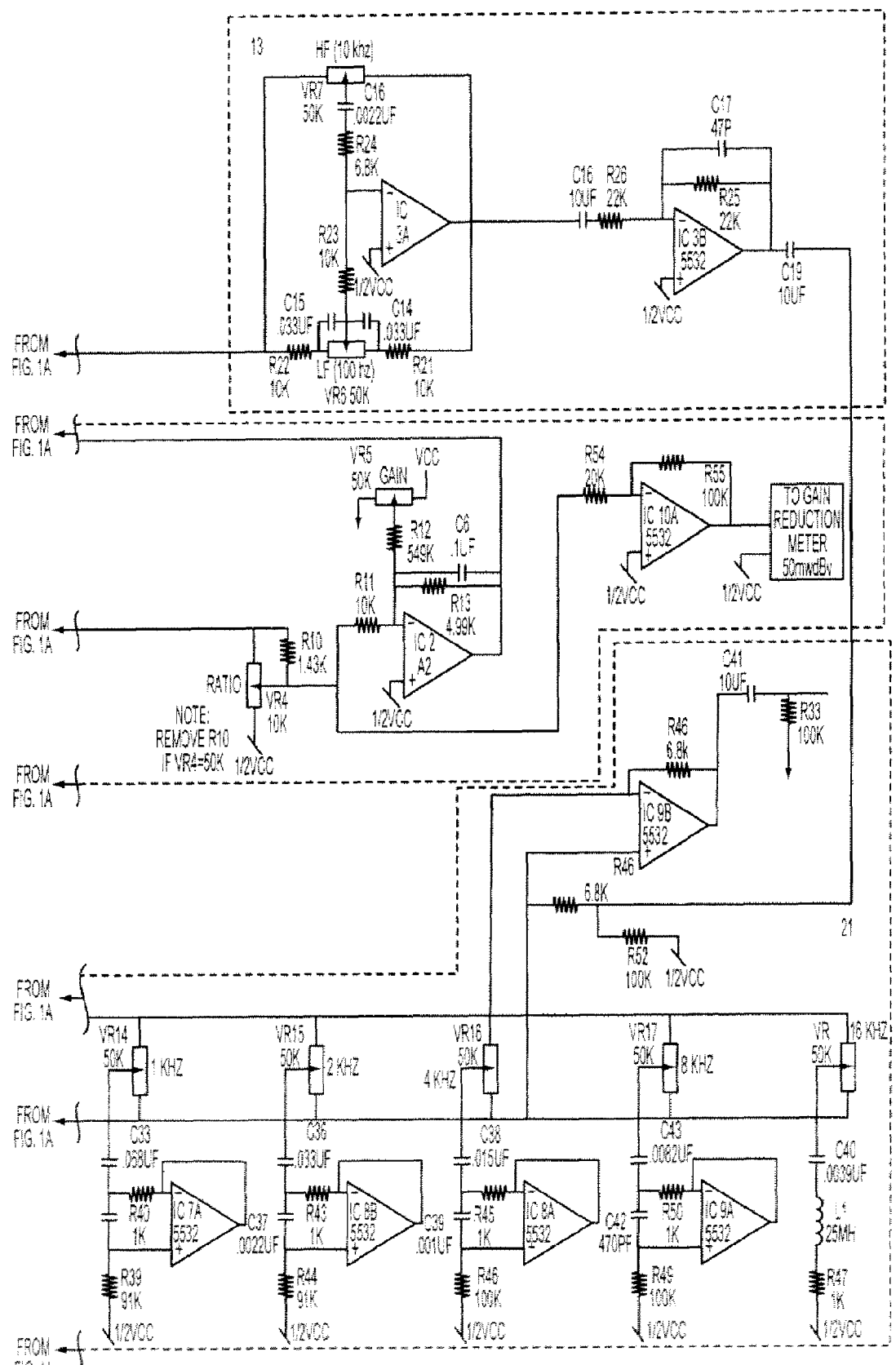
Figure 2A:
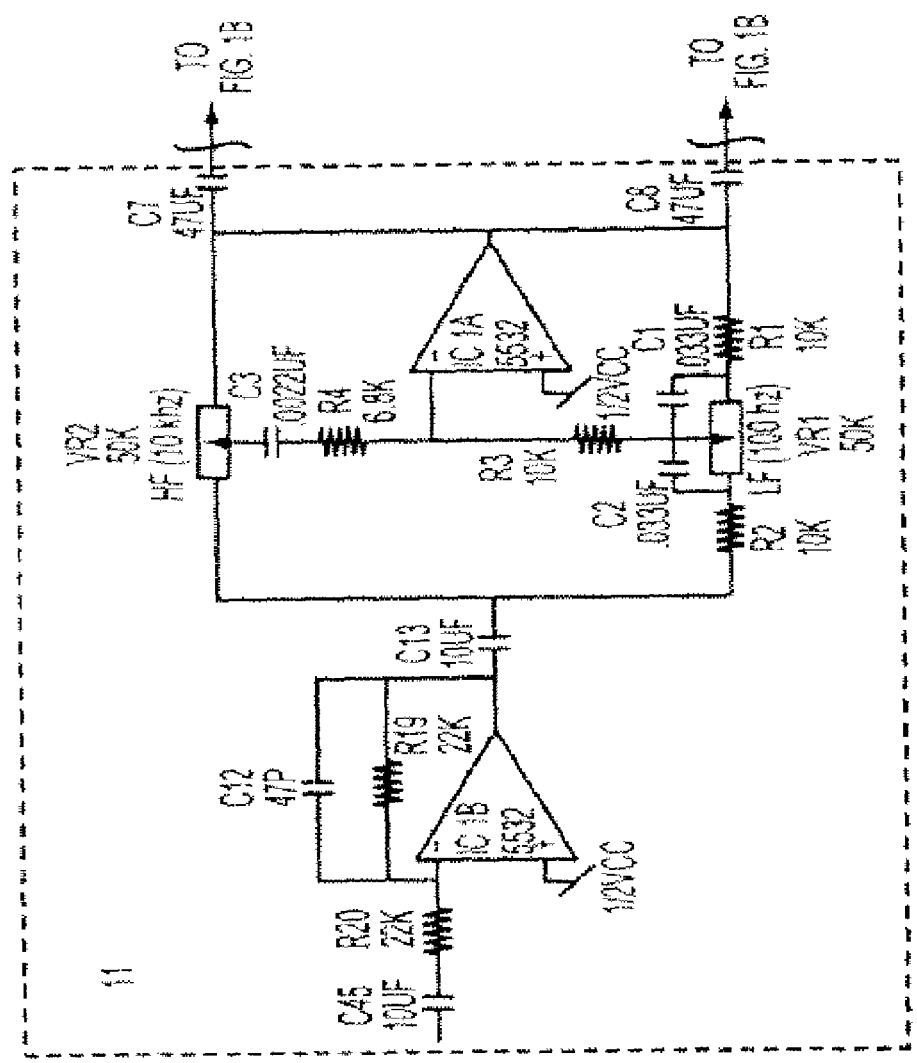
FIGS. 2A-2E is a diagram of a preferred circuit for the system of FIGS. 1A-1B.

Referring to the drawings, FIGS. 1A-1B is a schematic view of an audio system 10 for presenting sound in a high noise environment. The system 10 comprises an equalizer 11 having an input 11A and an output 11B for receiving an audio signal (preferably an analog electrical signal in the audio frequency range) and reducing the amplitude of the portion of the signal corresponding to the bass spectrum of sound while increasing the amplitude corresponding to the treble spectrum. Ideally the low audible bass portion (taken at 100 Hz) is reduced by about 10 dB, the high audible treble portion (taken at 8 kHz) is increased by about 8 dB, and the portions in between are reduced or enhanced in a linearly proportional manner, i.e. the increase is a substantially linear function of frequency. A variety of suitable equalizing circuits are known in the art. The preferred circuit for the equalizer is shown in block 11 of FIG. 2A.

Figure 2B:
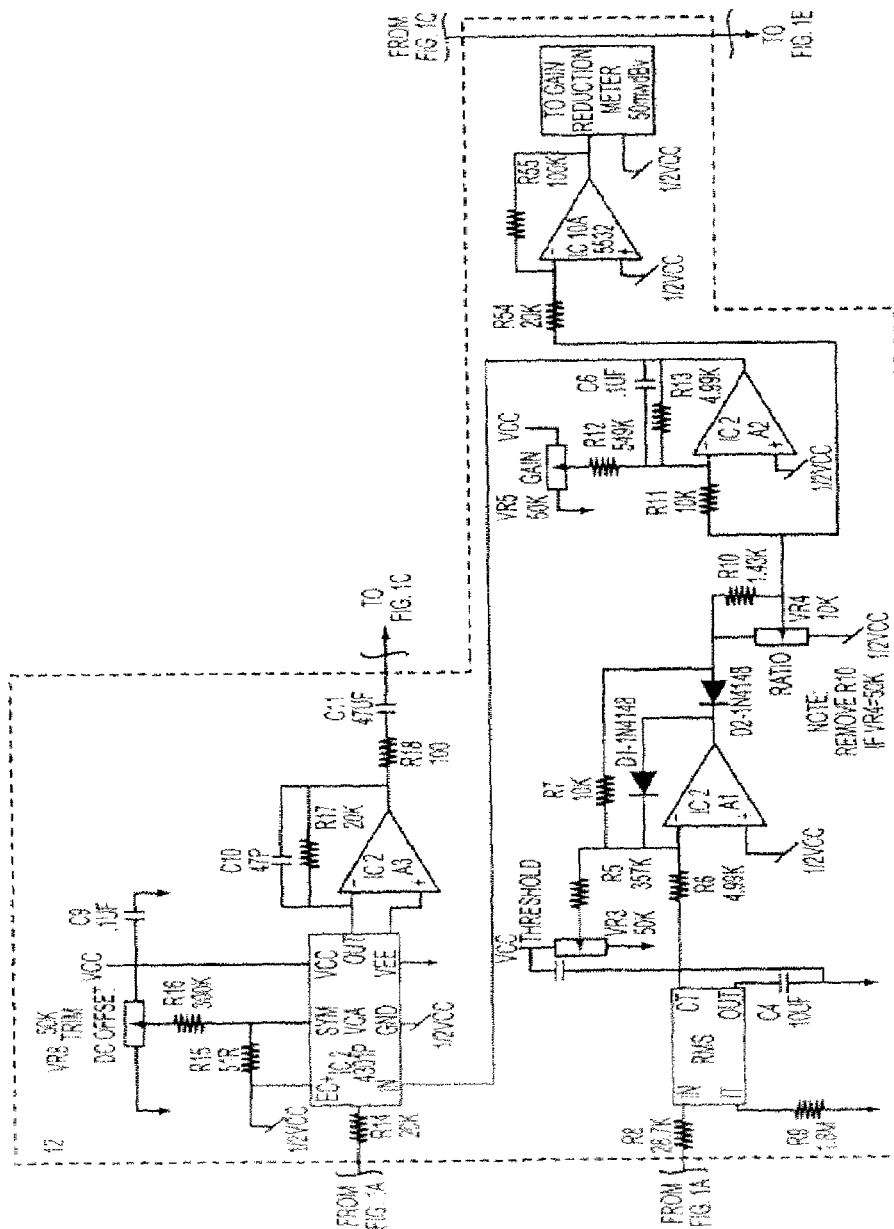

Referring back to FIGS. 1A-1B, the equalized audio signal from 11 is applied to the input of a compressor 12. The compressor has an input 12A and an output 12B. The compressor provides a degree of amplification which is inversely related to signal amplitude. Low amplitude portions of the signal are provided with higher gain amplification than high amplitude portions with the result that the dynamic range of represented sounds is lowered. (Quiet sounds would be raised; loud sounds would be lowered). Preferably the dynamic range is reduced to 10 dB or less. A variety of compressor circuits are known. The preferred compressor for the system of FIGS. 1A-1B is shown in block 12 of FIG. 2B.

Figure 2C:
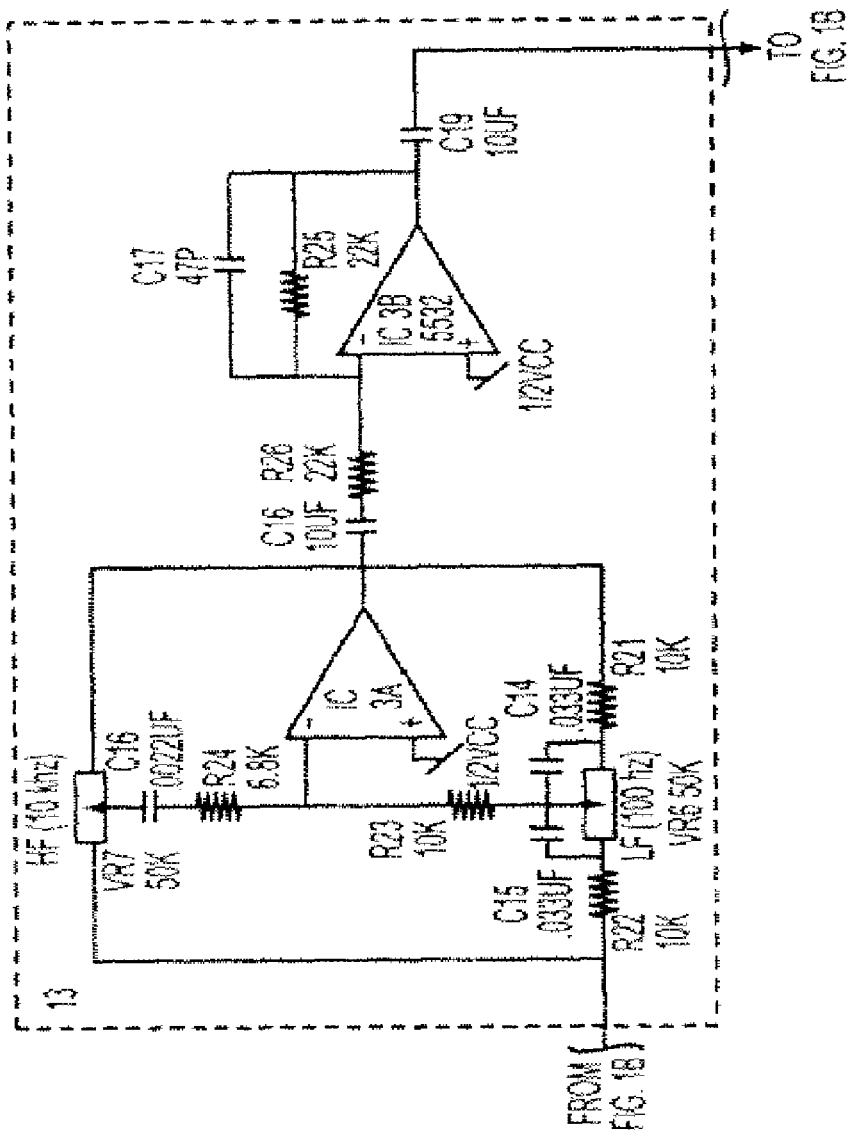
Figure 2D:
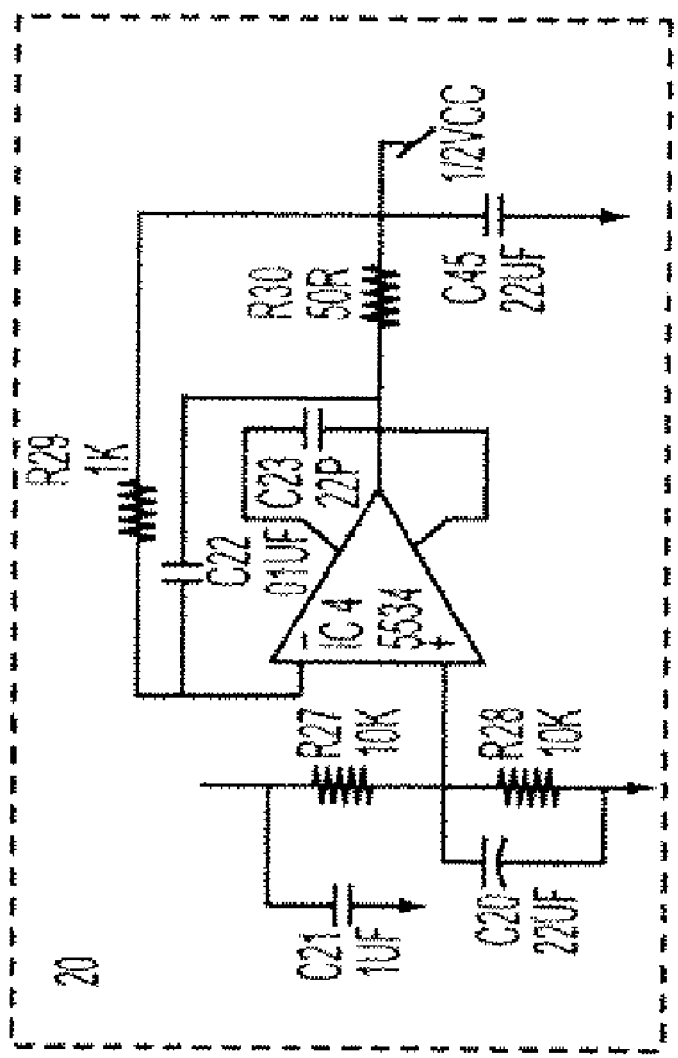
Figure 2E:
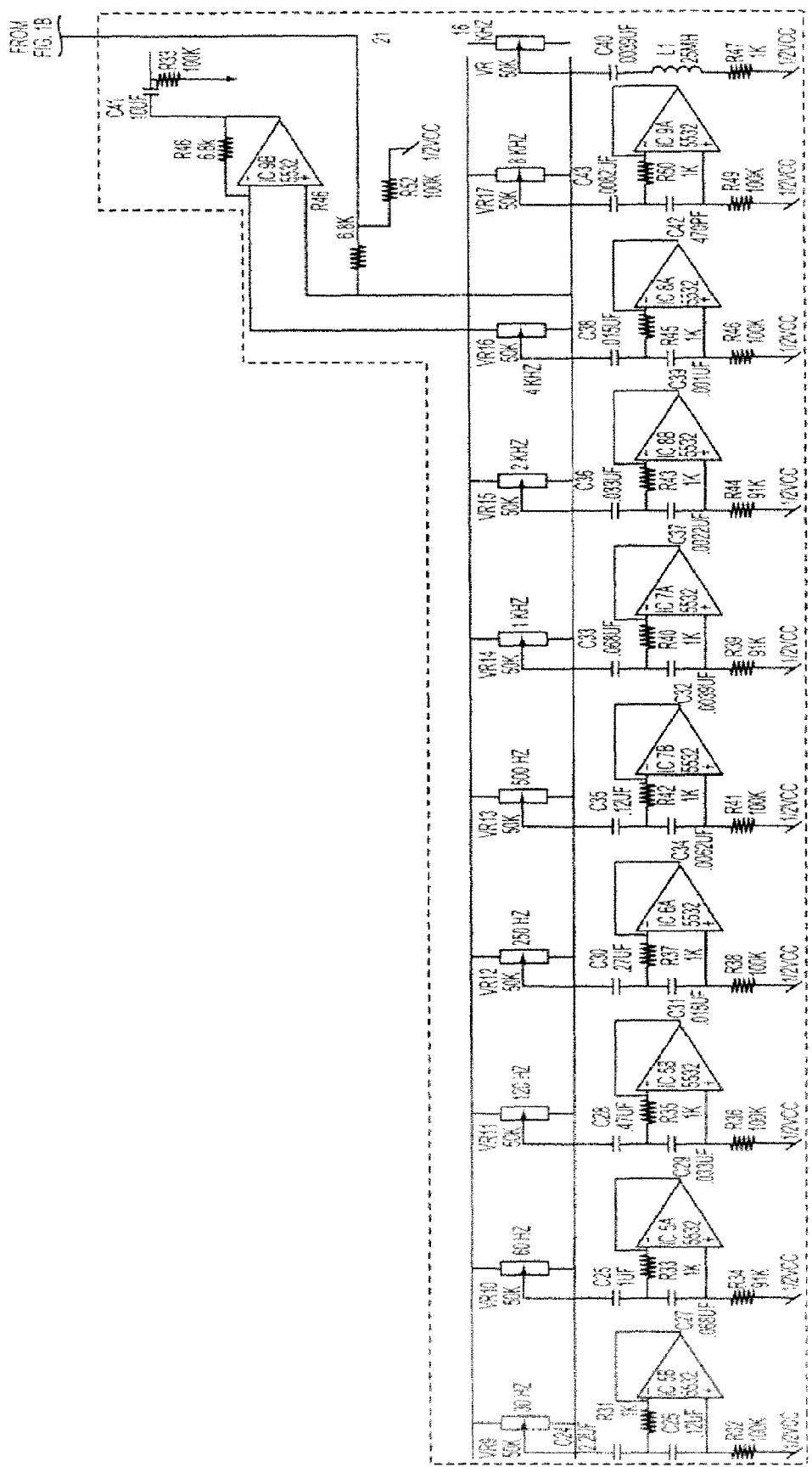

After compression the electrical audio signal is subjected to "mirror image" equalization in mirror image equalizer 13 having an input 13A and an output 13B. Equalizer 13 increases the bass portion of the signal while reducing the treble portion. Preferably the low audible bass portion (100 Hz) is increased about 10 dB and high audible treble portion (10 kHz) is reduced about 8 dB. The intermediate portions of the signal are reduced as a substantially linear function of frequency. The equalizer 11 and the "mirror image" equalizer 13 are ideally chosen so that they have equal and opposite affects. Block 13 of FIG. 2C is a schematic diagram of a preferred "mirror image" equalization circuit for the FIGS. 1A-1B system.

After equalization, compression and minor image equalization, the processed audio signal is applied to speaker system 14 either directly or through a multiple-band equalizer (not shown in FIGS. 1A-1B) for sound presentation. The speaker system can consist of small speakers (having magnets smaller than 10 oz), for presentation of sound in a high-noise environment. Because the bass portion was reduced before compression and enhanced after compression, the sound presented by the speakers has a spectrum rich in bass tones and free of the muffling effect encountered in conventional compression. And because the dynamic range is reduced by compression, the sound can be presented within the limited volume range between the 80 dB noise floor and the 110 dB threshold of unpleasant sensation.

FIGS. 2A-2E is a diagram of a preferred circuit for the system of FIGS. 1A-1B. The blocks in FIGS. 2A-2E are numbered to correspond to the same functional blocks in FIGS. 1A-1B. All of the components in FIGS. 2A-2E are standard commercially available components. The IC encompassing the components designated VCA, RMS, A1, A2 and A3 in block 12 of FIG. 1B is available from That Semiconductor Corp. under the product designation IC 4200.

Also shown as parts of the preferred circuit are an optional power supply 20 and a 10-band graphic equalizer 21 of FIG.

1E for a specific speaker assembly. The equalizer 21 of FIG. 1E is disposed at the output of mirror image equalizer 13 of FIG. 1C.

The signal processor described herein is designed to accommodate the conversion of music composition and movie sound tracks with wide dynamic ranges to a very narrow dynamic range without distorting or altering the original work. It is particularly suited for playing music or movies in high ambient noise environments such as aircraft or boats. Additional applications include shopping malls, performance theaters, automobiles, cabaret clubs as well as high noise environment where music or sound needs to be reproduced; e.g. amusement parks and racetracks.

By using equalization and compression in this fashion, the control of the frequency response of the program materials can be altered to such a degree that it can cause a transducer to pass the sound through conventional boat and aircraft interiors without exposing the transducer to the acoustic environment.

It is to be understood that the above-described embodiments are illustrative of only a few of the many possible specific embodiments which can represent applications of the principles of the invention. Numerous and various other arrangements can be made by those skilled in the art without departing from the spirit and scope of the invention.

What is claimed is:

1. A method for processing an electrical audio signal for presentation of enhanced quality sound in a high noise environment comprising:

equalizing a received audio signal by reducing the amplitude of low frequency portions of said audio signal corresponding to audible bass sounds and increasing the amplitude of high frequency portions of said audio signal corresponding to audible treble sounds using an equalizing circuit;

compressing the dynamic range of said equalized audio signal by attenuating high amplitude portions of said equalized audio signal relative to low amplitude portions of said equalized audio signal using a compressor circuit; and mirror image equalizing said compressed equalized audio signal by increasing the amplitude of said low frequency portions of said compressed equalized audio signal and decreasing the amplitude of said high frequency portions of said compressed equalized audio signal using a mirror image equalizing circuit.

2. The method of claim 1, further comprising a speaker system responsive to the output of said mirror image equalizing circuit.

3. The method of claim 1, wherein said high noise environment has an average noise floor in excess of about 80 dB and said compressor circuit can compress the dynamic range of said equalized audio signal to less than about 10 dB.

4. The method of claim 1, wherein said equalizer circuit reduces the amplitude of said low frequency signal portion by about 10 dB at 100 Hz and increases said high frequency signal portion by about 8 dB at kHz.

5. The method of claim 1, wherein said equalizer circuit decreases the amplitude as a substantially linear function of signal frequency.

6. The method of claim 1, wherein said mirror image equalizer circuit increases the amplitude of said low frequency signal portion by about 10 dB at 100 Hz and reduces the amplitude of said high frequency signal portion by about 8 dB at 8 kHz.

7. The method of claim 1, wherein said mirror image equalizer increases amplitude as a substantially linear function of signal frequency.

8. The method of claim 2, wherein said speaker system consists of speakers having small speaker magnets each magnet weighing less than about 10 oz.

* * * * *